United States Patent [19]

Rubinstein

[11] Patent Number: 4,792,924
[45] Date of Patent: Dec. 20, 1988

[54] SINGLE RAIL CMOS REGISTER ARRAY AND SENSE AMPLIFIER CIRCUIT THEREFOR

[75] Inventor: Jorge Rubinstein, Brighton, Mass.
[73] Assignee: Digital Equipment Corporation, Maynard, Mass.
[21] Appl. No.: 692,815
[22] Filed: Jan. 16, 1985
[51] Int. Cl.⁴ .............................................. G11C 11/40
[52] U.S. Cl. .................................... 365/154; 365/190
[58] Field of Search ........................ 365/154, 156, 190

[56] References Cited

U.S. PATENT DOCUMENTS

| | | | |
|---|---|---|---|
| 3,493,786 | 2/1970 | Ahrons et al. | 365/95 |
| 4,149,268 | 4/1979 | Waters | 365/95 |
| 4,435,787 | 3/1984 | Yasuoka | 365/190 |
| 4,441,169 | 4/1984 | Sasaki et al. | 365/154 |

*Primary Examiner*—James W. Moffitt
*Attorney, Agent, or Firm*—Nutter, McClennen & Fish

[57] ABSTRACT

A storage cell and a sense amplifier for use in a register or other memory in an integrated circuit. The storage cell has single-rail input and output, thereby eliminating the necessity of differential input lines and access transistors. The cell also has dual individually-addressable output buses. The sense amplifier includes a master latch connected to the bit line from the storage cell and a slave latch connected to the output. The master latch is normally maintained at its meta-stable condition by a normally-enabled gate. When the content of a storage cell is to be read, the cell outputs a signal onto the bit line, which signal drives the master latch to one side of its meta-stable state. The gate is turned off, allowing the master latch to go to the nearest stable state. The slave latch is connected to the master latch and assumes a state in response thereto. The slave latch and master latch are then disconnected and the master latch returned to its meta-stable state.

7 Claims, 2 Drawing Sheets

SINGLE RAIL CMOS REGISTER ARRAY AND SENSE AMPLIFIER CIRCUIT THEREFOR

BACKGROUND OF THE INVENTION

1. Field of the Invention

The invention relates generally to the field of electronic data processing systems, and more specifically to the portions thereof for storing data. The invention finds particular utility in register arrays used, for example, in processors and in other data storage elements, particularly those fabricated in integrated circuit chips.

2. Description of the Prior Art

Microprocessors generally include a plurality of storage elements that are arrayed in registers, each register having a selected number of the storage elements. The registers store information in a register-by-register basis, the information being used by processing elements in the microprocessor. Each register in the array is individually-addressable, and when a register is addressed, the contents of all of the storage elements forming the register, representing the states or conditions of the storage elements, are transmitted to the other circuitry on the microprocessor.

Each storage element in a register array typically includes a flip-flop having two stable states, each representing a binary one or zero, an input circuit and one or more output circuits. If a register array is used as a general purpose register for storing addressing, control or arithmetic information, for example, it may be connected to the inputs of an arithmetic/logic unit (ALU). Typical ALUs normally have two input terminals for receiving input signals from two input buses, each bus including bit or signal lines connected to corresponding storage elements in all of the registers. Registers selected by register addressing circuitry transmit signals representative of the states of the respective flip-flops over the bit lines of the input buses to the inputs of the ALU. The storage elements also may be provided with two output terminals, each of which is connected to transmit signals representing the stored contents over one of the output buses to the corresponding input terminals of the ALU. The register output terminals are individually-selectable or addressable on a register-by-register basis, so that each of the ALU input terminals may contemporaneously receive signals from different ones of the registers.

In present register arrays, the signal lines provide for differential signals to the flip-flops forming the storage elements. Such differential signals typically allow for a reduction in noise interference with the input signal, but also requires two input lines each carrying one of the differential signals. In addition, since the registers are also separately addressable, the register inputs require input transistors on each of the differential lines. Both the second lines and the input transistors therefor take up valuable chip space on a microprocessor, reducing the amount of space available for other circuitry and making layout thereof more difficult. Accordingly, it is desirable to eliminate the differential arrangement and have a single line, or rail, for the storage elements in the registers.

Between the outputs of the storage elements and any downstream circuitry, for example, the inputs of an ALU or terminals for connection to a bus, is a set of sense amplifiers which amplify the output signals from the addressed storage elements The output signals from the flip-flops may be relatively weak, since the transistors forming the flip-flops may be required to drive bit lines which have a relatively high capacitance. Furthermore, in view of the high capacitance of the signal lines, the time required for the signals on the bit lines to achieve the levels required to be sensed by the sense amplifiers may be quite long. The sense amplifiers must be able to rapidly detect the weak signals from the register storage elements and determine the level of the signals. Accordingly, it is desirable to provide a sensitive sense amplifier to reduce the amount of delay of the sense amplifier sensing the state of the signal from the selected flip-flop.

SUMMARY OF THE INVENTION

The invention provides a new and improved storage arrangement including a new single-rail storage cell and an improved sense amplifier. The storage cell has a connection to a write input bus having a signal input line and connections to two read output buses. The connections to the read output buses are individually addressable so that the data retrieved over the buses at any one time may come from different cells. The sense amplifier circuit has an improved immunity to noise disturbance and an improved response time, more rapidly sensing the state of the contents of the addressed storage cell during a read operation.

In brief, the storage array includes a plurality of storage cells arranged in a plurality of words each having a selected number of bits. The cells forming the storage array are accessed on a word-by-word basis, with all of the cells in each word being activated to receive and store or to transmit data in parallel. Each storage cell includes a forward cell inverter and a reverse cell inverter, with the output of each inverter being connected to the other's input. The reverse cell inverter has a weaker current driving capability than the forward cell inverter for single rail writability. Each bit line of the write bus is a single-rail bit line which is connected, in each word, through a write access transistor to the input of the forward cell inverter. The output of the forward cell inverter in each word is also connected to a single-rail bit line in each of two read buses through respective read access transistors. The write and read access transistors are controlled by address decoders which receive and decode addresses identifying the words in the storage array to receive and store data from, or to transmit data over, the respective read and write buses.

Each bit line in each of the read buses is connected to a sense amplifier which determines the state of the contents of the associated bit in the addressed storage word. Each sense amplifier includes a master latch, which is normally maintained at its meta-stable state, and which is connected to a slave latch. When a cell is accessed, which occurs when its read access transistor for that bit line is turned on, the master latch receives a signal which drives it slightly to one side of its meta-stable state, that is, partially towards one of its two stable states. The stable state toward which the master latch is driven depends on the state of the accessed cell. The master latch is then isolated from the read bus bit line and allowed to go to the stable state toward which it was driven by the signal from the read bus bit line. The master latch is then connected to the slave latch, which shifts to one of its stable states depending on the state of the master latch. The master latch is then isolated from the slave latch, returned to its meta-stable state and reconnected to the read bus, at which time the contents of another register may be accessed. The output of the slave latch, which is a function of the state of the accessed cell and the master latch, constitutes the output of the sense amplifier.

BRIEF DESCRIPTION OF THE DRAWINGS

The invention will be pointed out with particularity in the appended claims. The above and further advantages of the invention may be better understood by referring to the following detailed description taken in conjunction with the accompanying drawings, in which:

DETAILED DESCRIPTION OF AN ILLUSTRATIVE EMBODIMENT

Figure 1:
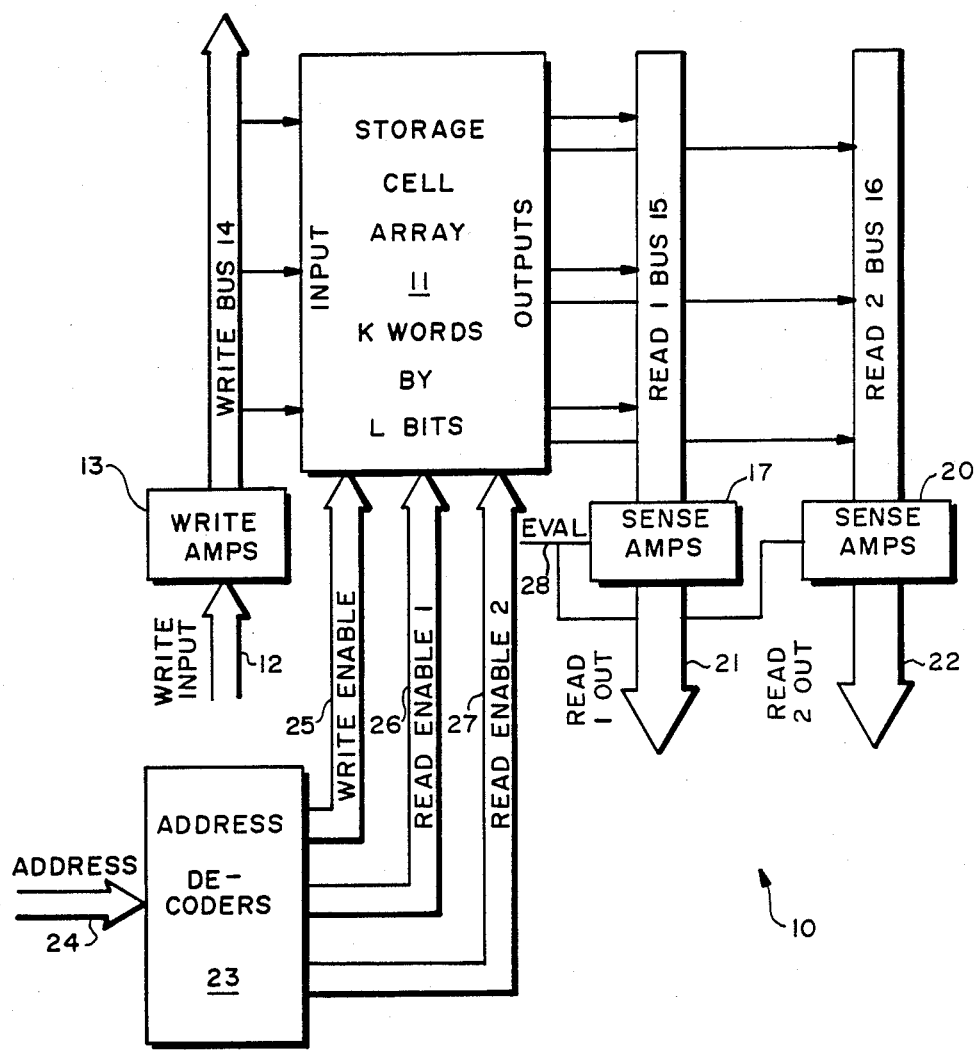
FIG. 1 is a general block diagram of a storage arrangement constructed in accordance with the invention.

With reference to FIG. 1, a storage arrangement 10 includes a storage cell array 11 including a plurality of storage cells arranged in "K" registers each having a selected number ("L") of bits. In the storage cell array, data is written into, or stored in, all of the storage cells in a register on a register-by-register basis. Similarly, the data stored in the individual words of the storage cell array 11 is transmitted from all of the storage cells in a register in a register-by-register basis.

The write data is transmitted in a conventional manner to storage arrangement 10 as WRT INP write input signals over a write input bus 12. The WRT INP write input signals are amplified by write amplifiers 13 and transmitted to a write bus 14. Both write input bus 12 and write bus 14 have the same number of lines as the number of cells ("L") in a register in the storage cell array 11, so that each line is coupled to one of the storage cells in each register in array 11.

The read data is transmitted from storage cell array 11 to either a read 1 bus 15 or a read 2 bus 16. Like the write bus 14, the read 1 and 2 buses 15 and 16 each include a bit line associated with one bit in each register in the storage cell array; thus, each read bus 15 and 16 has "L" lines. Bus 15 is connected to a set of sense amplifiers 17, each of which, in response to an EVAL evaluate signal received on line 28, amplifies the signal on one of the lines of bus 15. The state of the output of each of the sense amplifiers 17 thus reflects the state of the corresponding bit of the accessed storage cell. Similarly, bus 16 is connected to a set of sense amplifiers 20 which receive the signals from storage cell array 11. The outputs of sense amplifiers 17 and 20 are transmitted over the read 1 and 2 output buses 21 and 22, respectively, to other circuitry (not shown).

Figure 2:
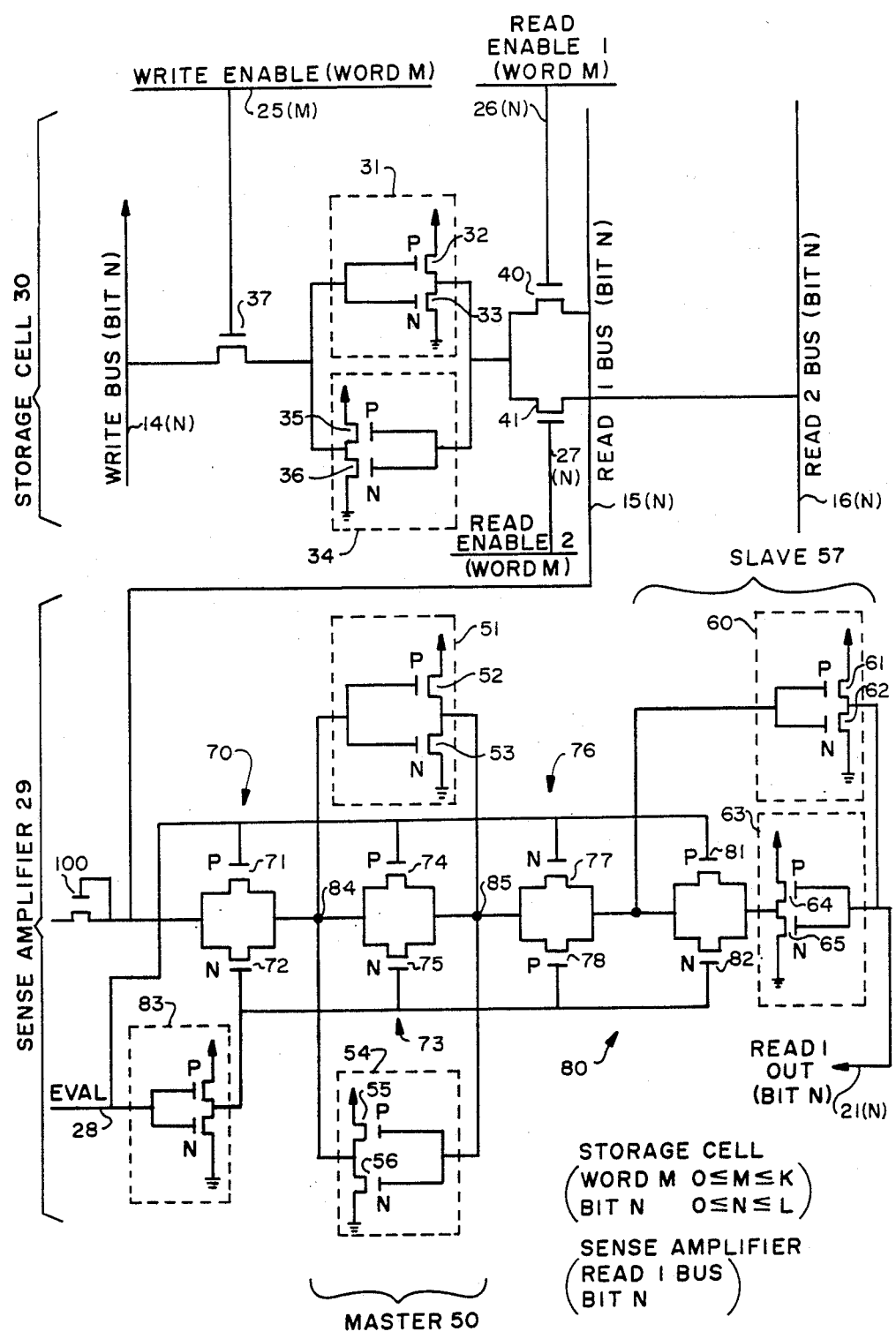
FIG. 2 is a circuit diagram depicting a storage cell and sense amplifier useful in the storage array depicted in FIG. 1.

As has been noted, the storage cells forming storage cell array 11 are arranged to read and write data in a register-by-register basis. A set of address decoders 23 receives address signals from other circuitry (not shown) over lines 24 and generates WRT EN write enable signals which are transmitted over lines 25, or RD EN 1 read enable 1 signals transmitted over lines 26, and RD EN 2 read enable 2 signals which are transmitted over lines 27, all to the storage cell array 11. The WRT EN write enable signals identify the particular register of storage cell array 11 which is to receive and store the signals on write bus 14. Similarly, the RD EN 1 read enable 1 signals transmitted over bus 26 identify the register of storage cell array 11 whose contents are to be transmitted over read 1 bus 15, and the RD EN 2 read enable 2 signals transmitted over bus 27 identify the register of storage cell array 11 whose content are to be transmitted over bus 16. Each of buses 25, 26 and 27 have "K" lines, with each line being connected to all of the cells in a corresponding register FIG. 2 depicts a schematic circuit diagram of a storage cell 30 and a sense amplifier 29 useful in the arrangement 10 depicted in FIG. 1. Storage cell 30 is a storage cell which forms part of storage cell array 11 and sense amplifier 29 is one of sense amplifers 17. The storage cell includes a forward cell CMOS inverter 31, comprising a PMOS pull-up transistor 32 and an NMOS pull-down transistor 33, connected in series between a positive power supply and ground. The storage cell 30 also includes a reverse cell CMOS inverter 34, which also comprises a PMOS pull-up transistor 35 and an NMOS pull-down transistor 36 connected in series between the positive power supply and ground.

The reverse cell CMOS inverter preferably has a weaker current-driving capability than the forward cell CMOS inverter for single-rail writability. Since the reverse cell inverter is weaker, a smaller signal is required from the single write bus line 14(N) and write access transistor 37 to overcome the signal from reverse cell inverter 34 and to drive forward cell inverter 31 to the desired condition.

Inverters 31 and 34 together form a flip-flop having two stable states with the state of the flip-flop indicating the data stored in storage cell 30. The output ofeach inverter 31 and 34, which is taken from the node between the pull-up and pull-down transistors of the respective inverters, is connected to both gates of the transistors of the other inverter. Also connected to the gate terminals of the forward cell inverter is a write access transistor 37 which, when energized by an asserted WRT EN (WORD M) write enable signal for register "M", which signal is received over line 25(M) of write enable bus 25 (FIG. 1) couples a WRITE BUS (BIT N) signal, from line 14(N) of write bus 14 (FIG. 1), to the input of forward cell inverter 31, and specifically to the gate terminals of the transistors 32 and 33 which form the forward cell inverter 31. The output signal from the forward cell inverter 31 comprises the complement of the signal received on line 14(N). This output signal is again inverted by the transistors 35 and 36 in reverse cell inverter 34, and the output signal of the reverse cell inverter 34 accordingly is the same as the input signal from line 14(N). Thus, when the WRT EN (WORD M) signal on line 25(M) turns off write access transistor 37, thereby isolating inverters 31 and 34 from the line 14(N), the input signal to forward cell inverter 31 is maintained by reverse cell inverter 34 in the same condition as it was drive by the signal from line 14(N).

The output of forward cell inverter 31 is also connected to read access transistors 40 and 41, which are connected to bit lines 15(N) and 16(N) of read 1 bus 15 and read 2 bus 16, respectively. The gate terminal of transistor 40 is connected to line 26(N) of read enable 1 bbus 26. Line 26(N) couples a RD EN 1 (WORD M) signal to the gate of transistor 40. When this signal is asserted, transistor 40 is enabled to conduct, thereby coupling the output of forward cell inverter 31 to line 15(N) of read 1 bus 15.

Similarly, the gate terminal of read access transistor 41 is connected to line 27(N) of read enable 2 bus 27 to couple a RD EN 2 (WORD M) read enable 2 (WORD M) signal from bus 27 to transistor 41. When this signal is asserted, transistor 41 is enabled to conduct the output of forward cell inverter 31 to line 16(N) of read 2 bus 16.

In one specific embodiment, write access transistor 37 and read access transistors 40 and 41 are preferably formed in NMOS. Using current CMOS technology for forward and reverse cell inverters 31 and 34, the access transistors will have smaller device sizes using NMOS than if they were formed in PMOS.

The sense amplifier 29 is depicted in FIG. 2 as being connected to line 15(N); however, a similar sense amplifier may also be connected to line 16(N) and to other bit lines in other cells (not shown). It will also be appreciated that corresponding storage cells associated with bit N in the other words of cell storage array 11 are also connected to bit line 15(N), and the contents of the respective cells transmitted to the sense amplifier 29 when address decoder 23 turns on their read 1 access transistor((corresponding to transistor 40). The sense amplifier includes a master latch 50, which includes a forward inverter 51 having pull-up and pull-down transistors 52 and 53, and a reverse inverter 54 comprising a pull-up transistor 55 and a pull-down transistor 56. A slave latch 57 also includes a forward inverter 60 including pull-up transistor 61 and pull-down transistor 62, and a reverse inverter 63 comprising pull-up transistor 64 and pull-own transistor 65. In all of inverters 51, 54, 60 and 63, the pull-up transistor is connected to a positive power supply, and the pull-down transistor is connected to ground.

Sense amplifier 29 also comprises an isolation gate 70 comprising a PMOS transistor 71 and an NMOS transistor 72, a release gate 73 comprising a PMOS transistor 74 and an NMOS transistor 75, a capture gate 76 comprising an NMOS transistor 77 and a PMOS transistor 78, and a holding gate 80 comprising a PMOS transistor 81 and a NMOS transistor 82. Before any of the gate transistors connected to bit line 15(N) are turned on, the EVAL evaluate signal is negated (by circuitry not shown). The negated EVAL evaluate signal on line 28 is coupled directly to the gates of transistors 71, 74, 77 and 81, thereby turning on transistors 71, 74 and 81 and turning off transistor 77. An inverter 83 transmits the complement of the negated EVAL signal to the gates of transistors 72, 75, 78 and 82, thereby turning on transistors 72, 75 and 82 and turning off transistor 78. Thus, isolation gate 70, release gate 73 and holding gate 80 are turned on nnd capture gate 76 is turned off.

Since transistors 74 and 75 are on, the nodes 84 and 85 of master latch 50 are effectively connected together, causing master latch 50 to be in a meta-stable state midway between a high and a low state. A bit line pull-up transistor 100 connected to a positive power supply (not shown) provides a voltage drop that brings line 15(N) to a mid-point between the positive power supply voltage and ground, maintained there by the master latch 50 in its meta-stable state. When the READ EN 1 (WORD M) signal is asserted, the gate 40 is turned on allowing the voltage level on line 15(N) to go slightly up or down, depending on the state of the output signal of forward cell inverter 31. In either case, the master latch 50 is driven slightly to the high side or low side of its meta-stable state.

When the contents of the addressed register are to be read by the sense amplifier, the EVAL evaluate signal is asserted, turning off transistors 71 and 72 comprising isolation gate 70, thereby isolating master latch 50 from line 15(N). Similarly, the EVAL evaluate signal turns off transistors 74 and 75 comprising release gate 73. Thus, nodes 84 and 85 are no longer effectively connected together, thereby allowing the master latch 50 to go to one of its two stable states, the state depending on the side of its meta-stable state to which the signal on line 15(N) drove the latch prior to the assertion of the EVAL evaluate signal.

Since the transistors 81 and 82 comprising holding gate 80 are off, the input to forward inverter 00 of slave latch 57 is isolated from reverse inverter 63. Further, since the transistors 77 and 78 comprising capture gate 76 are both on, the signal from the output of forward inverter 51 is effectively coupled to the input of the forward inverter 60. The forward inverter 60 is thus driven by the output of capture gate 76, which, in turn, is related to the state of master latch 50 at node 85. The output of forward inverter 60, which is transmitted over to line 21(N) of read 1 output bus 21 (FIG. 1) thus is a function of the state of forward cell inverter 31 in storage cell 30.

When the EVAL evaluate signal on line 28 is neated, gates 70, 73 and 80 are again turned on, and gate 76 is turned off. Since holding gate 80 is turned on, and capture gate 76 is turned off, reverse inverter 63 drives forward inverter 60 in the slave latch 57, enabling it to maintain the same state to which it was driven when the EVAL evaluate signal was asserted. The master latch 50 again is forced to its meta-stable state, thereby allowing the sense amplifier to be ready to accept the contents of another storage cell.

Preferably, the bit line pull-up transistor 100 is located near isolation gate 70. This reduces the amount of time required for the signal from the accessed storage cell 30 to reach the isolation gate and master latch 50, thereby enhancing the response time of the sense amplifier to the signal from the storage cell.

The foregoing description has been limited to a specific embodiment of this invention. It will be apparent, however, that the invention can be practiced in systems having diverse basic construction or in systems that use different internal circuitry than is disclosed in this specification with the attainment of some or all of the advantages of this invention. For example, the described embodiment has been CMOS circuitry, but the invention could be embodied in other forms of MOS or bipolar circuitry. In addition, the specific embodiment has been a register array and sense amplifier therefor, but the invention could be embodied in, for example, large-scale random access memories. Therefore, it is the object ff the appended claims to cover all such modifications and variations as come within the true spirit and scope of the invention.

What is claimed as new and desired to be secured by Letters Patent of the United States is:

1. A storage cell for use in a register array comprising:
   A. flip-flop means having a forward cell inverter and a reverse cell inverter each having an input terminal and an output terminal, the output terminal of each said cell inverter being connected to the input terminal of the other cell inverter;
   B. write input means for connection to a write data bus and to receive a write enabling signal and connected to the input terminal of said forward cell inverter for selectively coupling an input data signal from the write data bus to the input terminal of said forward cell inveter in response to the write enabling signal; and C. a first read output means connected to the output terminal of said flip-flop means and for connection to a first read data bus and to receive a first read enabling signal for selectively coupling the ottput of said forward cell inverter from the output terminal of said forward cell inverter to the first read data bus in response to the first read enabling signal and a second read output means for connection to a second read data bus and to receive a second read enabling signal and connected to the output terminal of said forward cell inverter for selectively coupling the output of said forward cell inverter from the output terminal of said forward cell inverter to the second read data bus in response to the second read enabling signal.

2. A storage cell as defined in claim 1 wherein said write input means includes transistor gate measn having an input terminal for connection to the write data bus, an output terminal conencted to the input terminal of said forward cell inverter and a gate terminal for connection to receive the write enabling signal, said transistor gate means for selectively coupling the signal at said input terminal to said output terminal in response to the write enabling signal at said transistor gate means.

3. A storage cell as defined in claim 1 wherein both said first and second rea means include transistor gate means having an input terminal connected to the output terminal of said forward cell inverter, an output terminal for connection to the respective read data bus, and a gate terminal for connection to receive the respective read enabling signal, said transistor gate means for seletively coupling the signal at its input terminal to its output terminal in eesponse to the read enabling signal at said transistor gate means.

4. A storage cell as defined in claim 1 wherein said reverse cell inverter has a relatively weak current-driving capacity to minimize the signal level required from said write input means to drive said forward cell inverter to the desired condition.

5. A storage cell for use in a register array comprising:

A. write input means for connection to a write data bus and to receive a write enabling signal for selectively coupling an input data signal from the write data bus to an input node in response to the write enabling signal;

B. flip-flop means having a forward cell inverter and a reverse cell inverter each having an input terminal and an output terminal, the input terminal of said forward cell inverter and the output terminal of the reverse cell inverter both being connected to the input node, and the input terminal of said reverse cell inverter and the output terminal of said forward cell inverter both being connected to an output node, the reverse cell inverter having a weak current driving capacity to minimize the level of a signal required at said input node from said write input means to drive said forward cell inverter to a desired condition; and C. a first read output means connected to the output terminal of said flip-flop means and for connection to a first read data bus and to receive a first read enabling signal for selectively coupling the output of said forward cell inverter from the output terminal of said forward cell inverter to the first read data bus in response to the first read enabling signal, and a second read output means for connection to a second read data bus and to receive a second read enabling signal and connected to the output terminal of said forward cell inverter for selectively coupling the output of said forward cell inverter from the output terminal of said forward cell inverter to the second read data bus in response to the second read enabling signal.

6. A storage cell as defined in claim 5 wherein said write input means includes transistor gate means having an input terminal for connection to the write data bus, an output terminal connected to the input terminal of said forward cell inverter and a gate terminal for connection to receive the write enabling signal, saisd transistor gate means for selectively coupling the signal at said inuut terminal to said output terminal in responsive to the write enabling signal at said transistor gate means.

7. A storage cell as defined in claim 5 wherein both said first and second read means include transistor gate means having an input terminal connected to the output terminal of said forward cell inverter, an output terminal for connection to the respective read data bus, and a gate terminal for connection to receive the respective read enabling signal, said transistor gate means for selectively coupling the signal at its input terminal to its output terminal in response to the read enabling signal at saisd transistor gate means.

* * * * *